(12) United States Patent
Srinivas et al.

(10) Patent No.: US 7,092,838 B1
(45) Date of Patent: Aug. 15, 2006

(54) METHOD AND APPARATUS FOR THE ANALYSIS AND OPTIMIZATION OF VARIABILITY IN NANOMETER TECHNOLOGIES

(75) Inventors: Prasanna Venkat Srinivas, Cupertino, CA (US); Atul Srinivasan, Santa Clara, CA (US); Shankar Krishnamoorthy, Saratoga, CA (US)

(73) Assignee: Sierra Design Automation, Inc., Santa Clara, CA (US)

( * ) Notice: Subject to any disclaimer, the term of this patent is extended or adjusted under 35 U.S.C. 154(b) by 0 days.

(21) Appl. No.: 10/860,812

(22) Filed: Jun. 4, 2004

(51) Int. Cl.
    *H01L 23/48* (2006.01)
(52) U.S. Cl. ................................................. 702/117
(58) Field of Classification Search ............ 702/117; 250/559; 700/108; 73/159, 150; 252/79; 356/612; 401/8; 336/602; 355/53
    See application file for complete search history.

(56) References Cited

U.S. PATENT DOCUMENTS

2004/0251544 A1* 12/2004 Hussa ...................... 257/734

2005/0104017 A1* 5/2005 Kimba et al. .......... 250/559.07

* cited by examiner

*Primary Examiner*—John Barlow
*Assistant Examiner*—Tung S. Lau
(74) *Attorney, Agent, or Firm*—O'Melveny & Myers LLP

(57) ABSTRACT

A method and apparatus are presented that can analyze the performance of an integrated circuit design at multiple corners, under multiple modes, and for multiple objectives efficiently and simultaneously. The extraction, timing analysis, and optimization functions are integrated into a mechanism that provides a novel problem formulation. A plurality of virtual timing graphs are maintained and updated simultaneously by providing a data structure that can efficiently store operating data for an arbitrary number of conditions at each node. This data structure is populated according to the design, and as optimizations are made, the operating data for all design conditions is updated simultaneously. Timing violations can be reported across all corners and modes. By integrating this multi-corner multi-mode analysis with circuit optimization, a convergent mechanism is provided. In this way, design constraints are evaluated simultaneously for an arbitrary number of design conditions.

22 Claims, 5 Drawing Sheets

METHOD AND APPARATUS FOR THE ANALYSIS AND OPTIMIZATION OF VARIABILITY IN NANOMETER TECHNOLOGIES

FIELD OF THE INVENTION

This invention relates to the field of computer-aided design of integrated circuits, and more specifically to the area of physical synthesis in deep-submicron processes.

BACKGROUND OF THE INVENTION

Integrated circuit design is an increasingly complex process and relies heavily on the use of computer-based tools. As designs get larger, and the critical dimension in fabrication processes shrink, the problem of evaluating and optimizing the physical design is becoming more burdensome. Current generation integrated circuits are being designed for processes with features sizes of 90 nanometers, 65 nanometers and smaller. Technology with feature sizes in this range are sometimes referred to as "deep-submicron" or "nanometer" technologies.

In nanometer technologies, many electrical properties that were previously second and third order effects have come to play a major role in determining circuit performance and power consumption. One reason for this is that shrinking geometries have caused the variability of design parameters to increase. For example, interconnect geometry parameters such as wire thickness and resistivity have an increasingly higher variation as a percentage of the total thickness and resistivity. Variability can be exhibited both inter-chip and intra-chip. Variability affects both device parameters and interconnect parameters and directly determines the margin and achievable yield of an integrated circuit design.

Variability comes from many sources. We can generally classify the source of variations into four groups: environmental, manufacturing, reliability and operational.

a. Environmental Variations

Environmental variations arise during the operation of a chip and include both global (inter-chip) and local (intra-chip) environmental variations. Global environmental variations include variations in chip ambient temperature and supply voltage. Local environmental variations are caused by variations in power supply, local coupling, and temperature across the chip.

Global environmental variations such as ambient temperature and supply voltage can change the electrical characteristics of devices. Worst case timing has been traditionally modeled using parameters characterizing a low voltage, a slow process and a high temperature. This approach is not always sufficient for nanometer technologies because such processes sometimes exhibit inverted temperature behavior, whereby the worst timing occurs at a low temperature rather than a high temperature. This inverted temperature behavior can be traced to transistor current-voltage (IV) characteristics. The transistor saturation current is dominated by: temperature mobility dependency above the temperature neutral point, and temperature threshold dependency below the temperature neutral point. The temperature inversion effect typically varies for each library cell and may get worse when lower operating voltages are used.

Local environmental variations are caused by the operation of the chip and include such local effects as:

Device voltage variations due to voltage drop (IR drop) and ground bounce

Delay and slew variations due to crosstalk

Input pin capacitance variation due to slew and state dependency

Device performance degradation due to negative bias temperature instability

IR drop and crosstalk induced variations are more prominent in nanometer technologies than in previous technologies. Previously, the capacitance seen at the input of a CMOS cell has been considered independent of all factors external to the cell. The increasing drain-to-gate capacitance has changed this assumption. Now it is often important to consider the Miller Capacitance effect, making the effective input capacitance a function of the load capacitance and the input slew. Effective pin capacitance usually increases with slew and decreases with cell output load. The dependency of input capacitance on the state of the cell adds further modeling complications.

b. Manufacturing Variations

Manufacturing variations result in permanent structural device and interconnect variations. These variations arise due to processing and masking limitations, and result in random or spatially varying deviations from designed parameter values. Manufacturing variations affect both interconnect and device characteristics and are experienced both globally (inter-chip) and locally (intra-chip).

Global manufacturing variations include global geometric variations in device and interconnect as well as material parameter variation in device and interconnect. Device geometric variations such as effective channel length variation and film thickness variation can result in systematic chip-to-chip threshold voltage (Vt) and leakage current variations. This threshold voltage variation affects delay and leakage power. Similarly deviations in the width of lower metal layers due to proximity and lithographic effects can directly impact line resistance as well as coupling capacitance. Global variation in metal and dielectric thickness also leads to global resistance and capacitance variations.

Local manufacturing variations include device and interconnect geometry variations due to local layout as well as random material parameter variation. Device effective channel length has some plasma etch dependencies (which depends on local layout) and it manifests itself in the form of local threshold voltage (Vt) variations. Interconnect local geometric variations include local layout dependent width and spacing variation, dishing and erosion of metal, as well as dielectric thickness variation.

Interconnect line width and spacing deviations arise primarily due to photolithographic and etch dependencies. For lower metal layers, lithographic and proximity effects may be important while at other levels aspect ratio dependent etch effects, which depend on local layout can be significant. These deviations directly impact interconnect parasitics and result in performance and signal integrity degradation.

Significant local metal thickness variation (10–20 percent) has been observed for nanometer copper technologies resulting in dishing and erosion. Similarly, chemical mechanical planarization (CMP) can introduce strong dielectric thickness variations across the die. Selective process bias (SPB) based on width and spacing to adjacent metal has been used to address local layout effect on interconnect. In nanometer technologies, dishing and erosion effects need to be modeled as well.

FIG. 1 is an illustration of one aspect of the problem addressed by the present invention. FIG. 1 shows local and global variation of inter-layer dielectric thickness across a wafer. Each square in FIG. 1 represents a single die and the entire surface illustrated represents a single wafer. The local variation of inter-layer dielectric thickness is represented by the vertical range of a single square, while the global variation is represented by the vertical range of the entire surface.

c. Reliability Variations

Reliability variations are caused by various wear-out mechanisms, in which device performance degrades over time. It should be ensured that the degradation does not cause functional or performance failures during or after the degradation. In nanometer technologies, negative bias temperature instability (NBTI) is expected to cause significant P-transistor performance degradation over device lifetime. It degrades the threshold voltage (Vt) as well as drive current of the P transistors. This is especially problematic for pull-up devices and can cause larger delays.

In some cases, it is desirable to model wear-out mechanisms for clock signals (which experience more switching over the lifetime of the chip) differently than for ordinary logic signals. Reliability variations can be modeled as either global variations (considering new and old characteristics globally as different operating points), or as local variations (considering old and new characteristics locally as different device characteristics), or some combination of the two.

d. Operational Variations

Operational variability refers to different operating modes of an IC. For example, an IC may be designed to work in functional mode, test mode, sleep mode, and power-off mode. Different modes come with different design constraints that must be simultaneously analyzed for fast design closure.

e. Traditional Approaches

Traditionally, variability has been handled through two-corner analysis. We use the term "corner" to refer to any combination of process, voltage and temperature (PVT), as well as other environmental, manufacturing or reliability factors. In a traditional two-corner analysis, late (i.e., setup) analysis is carried out for parameters characterizing a weak process, a minimum voltage, and a high temperature, and early (i.e., hold) analysis is carried out for parameters characterizing a strong process, a maximum voltage, and a low temperature. In such traditional approaches, nominal interconnect models are generally used everywhere and a bit of margin is used to cover up uncertainty.

One limitation of a traditional two-corner analysis is that signal integrity problems may be worse at other corners. For example, noise problems may only show themselves at a strong process and high temperature conditions.

Another problem with the traditional approaches is that they model certain variations as uncertainty when they are actually deterministic. In fact, a substantial portion of local variability is design and layout dependent and therefore deterministic. Similarly, many global variability sources (e.g., ambient temperature) can be known in advance and deterministically modeled. Operational variability is always deterministic.

Ideally, deterministic variability impact can be assessed and tuned out of the design. However, lack of modeling resources often transform variability into uncertainty and effectively convert systematic variation into randomized one.

Treating deterministic variability as uncertainty is both pessimistic and risky at the same time. It is pessimistic as is the nature of bounding methods that seek to deliver guarantees on the earliest and latest arrival times. Yet, it is risky because it is not possible to conduct a bounding analysis using only two corners.

Traditional methods require users to run each design variability corner individually and verify performance. At most, two-corner single-mode support is implemented in existing solutions. Thus, users are required to ping-pong between each variability corner and between different modes to fix all the timing paths in all the corners.

Another approach, statistical timing, has been proposed by some as a solution for handling variability. However, verifiable statistical device and interconnect models are not yet available. Also, there are significant hurdles involved in getting library vendors and designers to accept statistical timing analysis.

Thus, there is a need for a convergent method to handle variability in an integrated fashion to enable simultaneous analysis and optimization of all the different variability effects. Such a comprehensive variability solution is desirable in analysis and implementation tools for designing nanometer ICs in order to minimize systematic yield loss due to variability and achieve yields near defect-density limits.

SUMMARY OF THE INVENTION

An object of the present invention is to have an integrated and convergent method that can accommodate design variability in an efficient way so that performance can be analyzed and optimized over a large number of corners with a reasonable computational overhead.

In one embodiment, a user defines any number of corners and modes. Each corner can include an interconnect library, a device library and an objective. The objective for a corner can include flags indicating that any combination of setup time, hold time and noise should be analyzed. Each corner can also include de-rating values for the interconnect, the logic devices and the clock signals. Each mode can include a timing constraint along with other conditions.

Once the problem is formulated, the circuit can be analyzed across all combinations of corner and mode. This is done in an efficient fashion so that memory overhead and computational overhead is minimized. After timing analysis, the design can be queried for worst timing violations or other performance data. A query could be for a specific corner/mode combination, for a specific corner across all modes, for a specific mode across all corners, or across all combinations of corner and mode. In this way, the resulting data structure implements a virtual timing graph for each combination of corner and mode.

The timing analysis can also be integrated with optimization functionality. The worst timing violations across all combinations of corner and mode can be determined. As the circuit is optimized, the performance data is incrementally updated. This allows optimizations to be performed in such a way that they are guaranteed to improve the design across all corners and modes and for every defined objective. For example, it can be verified that an improvement at one corner/mode combination does not cause an even bigger decrease in performance at another corner/mode combination. Thus, a truly convergent multi-corner multi-mode optimization mechanism is provided.

DETAILED DESCRIPTION OF THE PREFERRED EMBODIMENT

Figure 1:
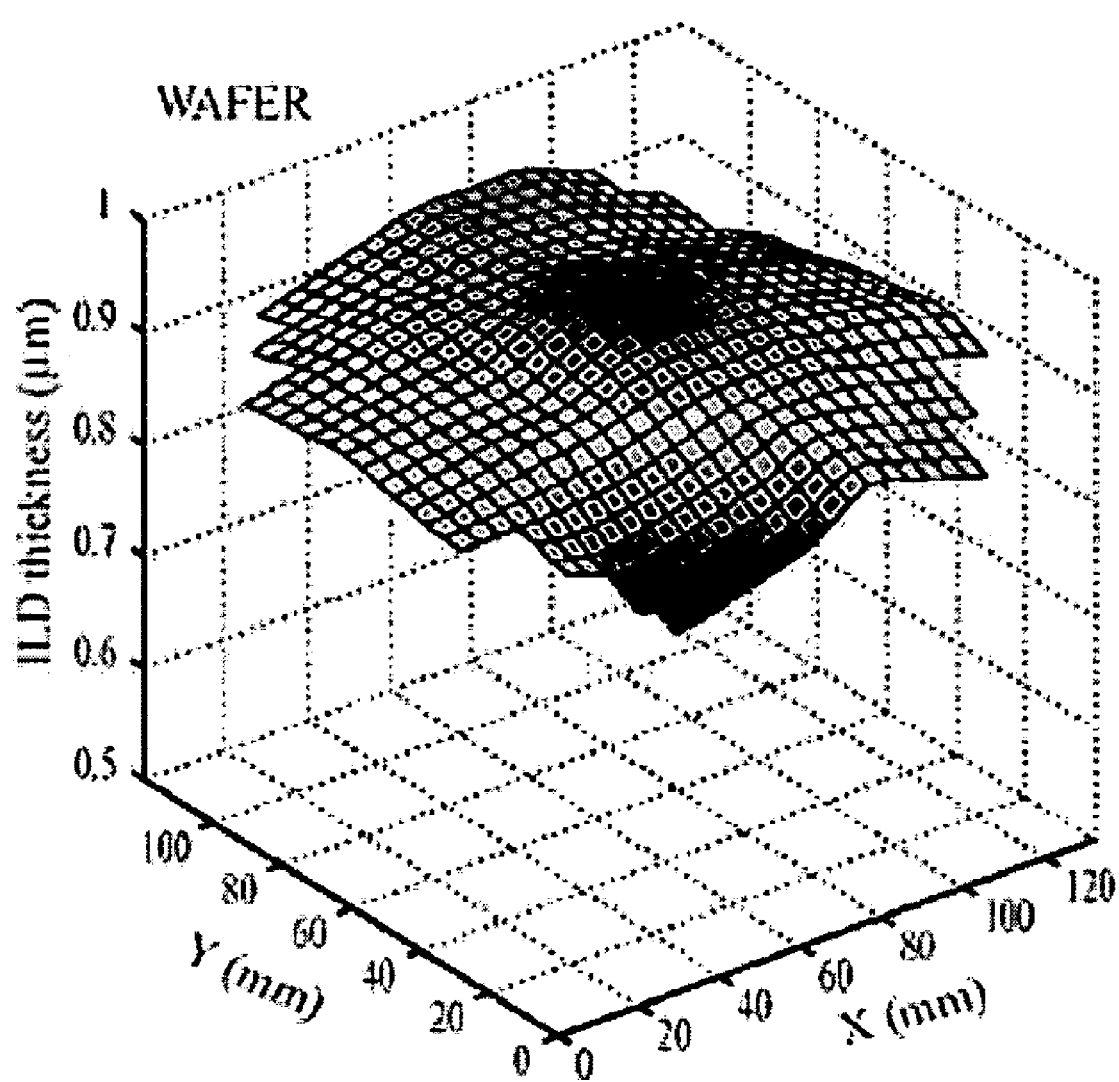
FIG. 1 is an illustration of one aspect of the problem addressed by the present invention, showing local and global variations of a manufacturing parameter.

A comprehensive design for variability solution is essential for designing nanometer integrated circuits with yields approaching defect-density limits. This is primarily due to the fact that nanometer technologies exhibit increasing overall variability and increasing local variability as a portion of the whole. Interconnect variability (especially in wire resistance), is not negligible and needs to be analyzed to the same degree as active device variability.

An object of the present invention is to electrically model deterministic variability explicitly, and provide such a model integrated into an analysis and optimization tool. This allows parametric (i.e., circuit-specific) yield loss to be minimized, results in chips that are robust and reliable, and avoids over-design. By presenting worst case violations across all operating conditions simultaneously, the optimizer can converge.

A preferred embodiment of the present invention involves the accurate modeling of deterministic interconnect variations as well as deterministic device variations. Interconnect variation from maximum resistance conditions (i.e., minimum cross sectional area) to maximum capacitance conditions (i.e., maximum cross sectional area) is considered. In addition, the analysis infrastructure is robust enough to handle device effects such as temperature inversion, NBTI and pin capacitance variations.

a. Problem Formulation

For the purpose of the following discussion, we classify variability into three categories:

Operational Variability
Global (inter-chip) Variability
Local (intra-chip) Variability Operational variability is designed-in and must be concurrently analyzed to minimize design iterations. Global and local variability are undesirable (but inevitable) and must be comprehensively accounted to maximize performance and minimize parametric yield loss. As discussed above, global variability and local variability can come from environmental, manufacturing as well as reliability sources. The categorization of variability into operational, global and local is important because each category is handled in a different way.

Operational variability is addressed by performing simultaneous analysis of multiple design modes. A preferred embodiment accepts mode specific timing constraints and performs analysis without mixing the data across different modes. Each mode represents different timing conditions and results in a different timing graph. Simultaneously analyzing multiple modes requires each timing graph to be represented. This can be thought of as having a virtual timing graph for each mode. These multiple virtual timing graphs are implemented using a single actual timing graph where each node is tagged to maintain information concerning how it is constrained in each mode.

Consider, for example, a single chip that needs to operate in an "active" mode, a "standby" mode and a "sleep" mode. The user may want to specify a 10 KHz clock for sleep mode, a 1 Mhz clock for standby mode and a 100 MHz clock for active mode. In addition to these design modes, there may be component modes, such as a RAM cell that has a "read" mode and a "write" mode. The design may contain multiple component modes and each component mode may itself have different timing information. Because each mode may result in a different timing graph and have different timing constraints, existing tools force users to treat one design mode at a time. A preferred embodiment of the present invention, all modes are maintained and optimized simultaneously, relieving the user from designing a suite of experiments, and eliminating the ping-pong effect in optimization.

Global variability is the difference in the value of a parameter across nominally identical die (whether those die are fabricated on the same wafer, on different wafer, in different lots, or in different fabrication plants). Global variability is typically accounted for in circuit design as a shift in the mean of some parameter value equally across all devices and structures on any chip, and is due to environmental, manufacturing and reliability sources.

Global variability is addressed in a preferred embodiment by performing simultaneous analysis across multiple analysis corners. An analysis corner reflects a particular global operating condition, for example a process, voltage, temperature (PVT) combination. A corner corresponds to a set of characterized device and interconnect libraries. Analysis corners can be configured for various analysis objectives, in particular setup time, hold time and noise. Because any number of corners can be defined, temperature inversion effects can be analyzed using a dedicated corner. Performance data is kept separately for each analysis corner and can be globally queried, allowing for simultaneous optimization.

Local variability is the deviation occurring spatially within any one chip. Such intra-chip variation may have a variety of sources depending on the physics of the manufacturing steps that determine the parameter of interest. In contrast to global variability (affecting all structures on any one chip equally), local on-chip variability contributes to the loss of matched behavior between structures on the same chip, and is due to environmental, manufacturing and reliability sources.

Local variability should be analyzed in the context of global variability by modeling variations around a corner. Some local environmental variability such as IR drop and crosstalk can be directly analyzed, while other variability, such as NBTI, can be analyzed by specifying two variation libraries around a corner. Local manufacturing variability in interconnect can be addressed by using selective process bias around a corner. Device threshold voltage (Vt) variations due to local manufacturing variability can be analyzed either by using multiple variation libraries around a corner or by using linear delay de-rating value.

In a preferred embodiment, the three categories of variability: operational, global and local are thus handled in three separate ways. Operational variability is handled by the definition of multiple modes and the maintenance of multiple virtual timing graphs. Global variability is handled by the definition of multiple corners, each with its own device and interconnect libraries, and local variability is handled by specifying variation around a corner (either through de-rating values or with multiple variation libraries).

Figure 2:
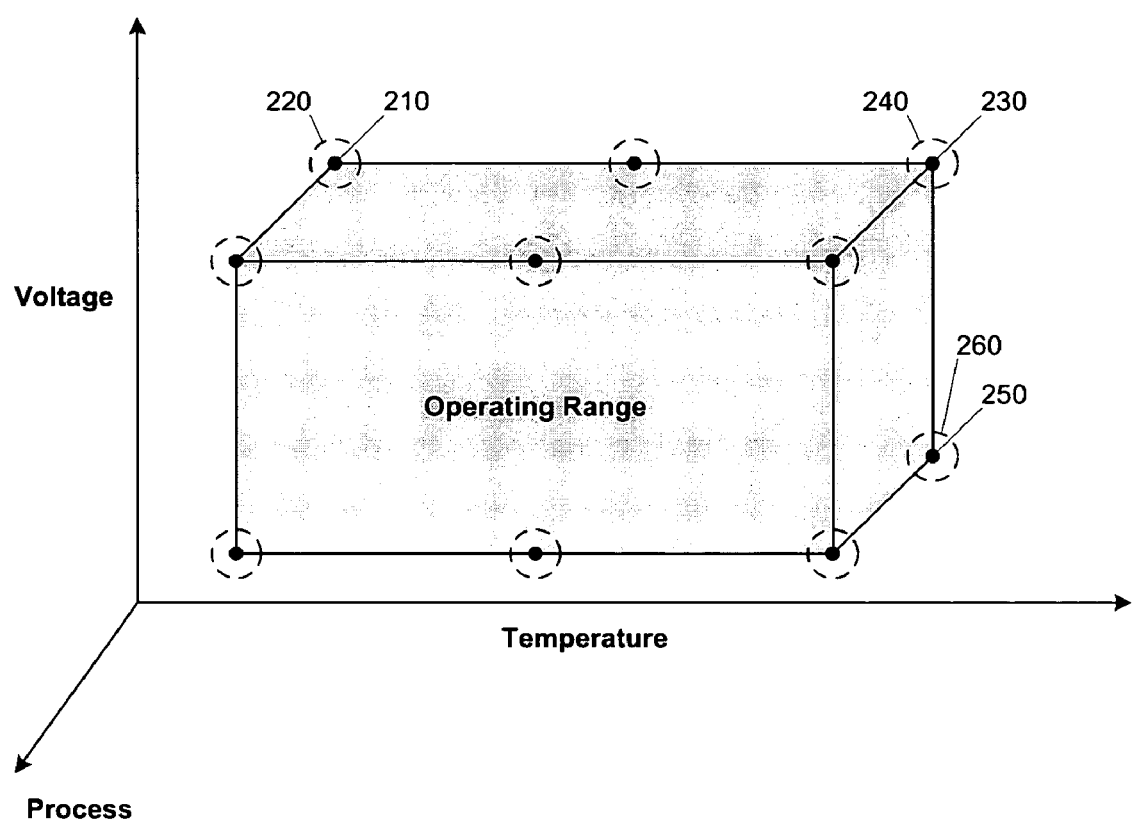
FIG. 2 illustrates multiple process, voltage, temperature corners and the local variation around each corner.

FIG. 2 illustrates a view of a design space, showing a design corner and a local variation region around each corner. Design corners 210, 230 and 250 define a specific combination of process, voltage and temperature. The range around each corner, illustrated by the dotted lines 220, 240 and 260, respectively, represents the local variation. For example, if design corner 210 is defined as a temperature of 25° C., the performance of the interconnect and the devices at 26° C. does not require a separate corner. Such a small variation can be accommodated using a de-rating value; however, interconnect and device performance at 140° C. would require re-characterization as performance would no longer be linear. Thus, a different corner at 140° C. would be used, referring to different interconnect and cell libraries.

The user interface of a preferred embodiment allows an arbitrary number of corners to be specified, and allows an arbitrary number of modes to be specified. A corner is more specifically a specification of the following items:

A Device Library Or Libraries For The Given Operating Conditions

An Interconnect Library For the Given Operating Conditions

An Objective

De-Rating Values

The interconnect library associated with a corner is provided in a preferred embodiment in a special process technology format (PTF) file. This file represents the interconnect parameters at that corner. The PTF file contains the data that models the variation of resistance and capacitance with width, spacing, thickness, etc.

The objective at a corner can be late timing, early timing, or noise, or any combination of the three. This defines the type of analysis that should be performed at the corner. A corner also specifies local variation by defining de-rating values or by specifying that min/max variation libraries should be used. De-rating values are separated into interconnect, logic and clock. This allows reliability effects to be modeled by using a higher de-rating values for clocks. Finally, corners can be enabled or disabled, allowing analysis and optimization to take place only on enabled corners.

This novel problem formulation reduces the burden on the user to simply defining the desired operating conditions. In contrast, prior art systems have forced the user to design a large collection of experiments using various combinations of corners and modes. At most two-corner, single mode design is supported by existing tools. This creates a scenario where optimizations are not guaranteed to converge, as an optimization at one corner/mode combination may cause an even bigger degradation in performance at another corner/mode combination.

b. Multiple Virtual Timing Graphs

In a preferred embodiment, a single timing graph with a new data structure is used to implement multiple virtual timing graphs. In principle, the preferred embodiment stores at each node the timing data associated with each corner/mode combination. A single traversal of the circuit graph is all that is needed to populate the data structure holding the multi-corner, multi-mode timing information. Because nodes are tagged with the appropriate mode-specific information, it is possible to recover a virtual timing graph for any corner and any mode, even in cases where certain arcs are disabled in certain modes, and in cases where certain paths are multi-cycle paths in certain modes but not in others.

An efficient data structure is used that minimizes the memory and CPU overhead of performing analysis over an arbitrary number of corners. Only the corners that are enabled, and only the objectives that are enabled for each enabled corner, occupy space in the data structure. This allows the memory footprint of the analysis engines to be small.

Figure 3:
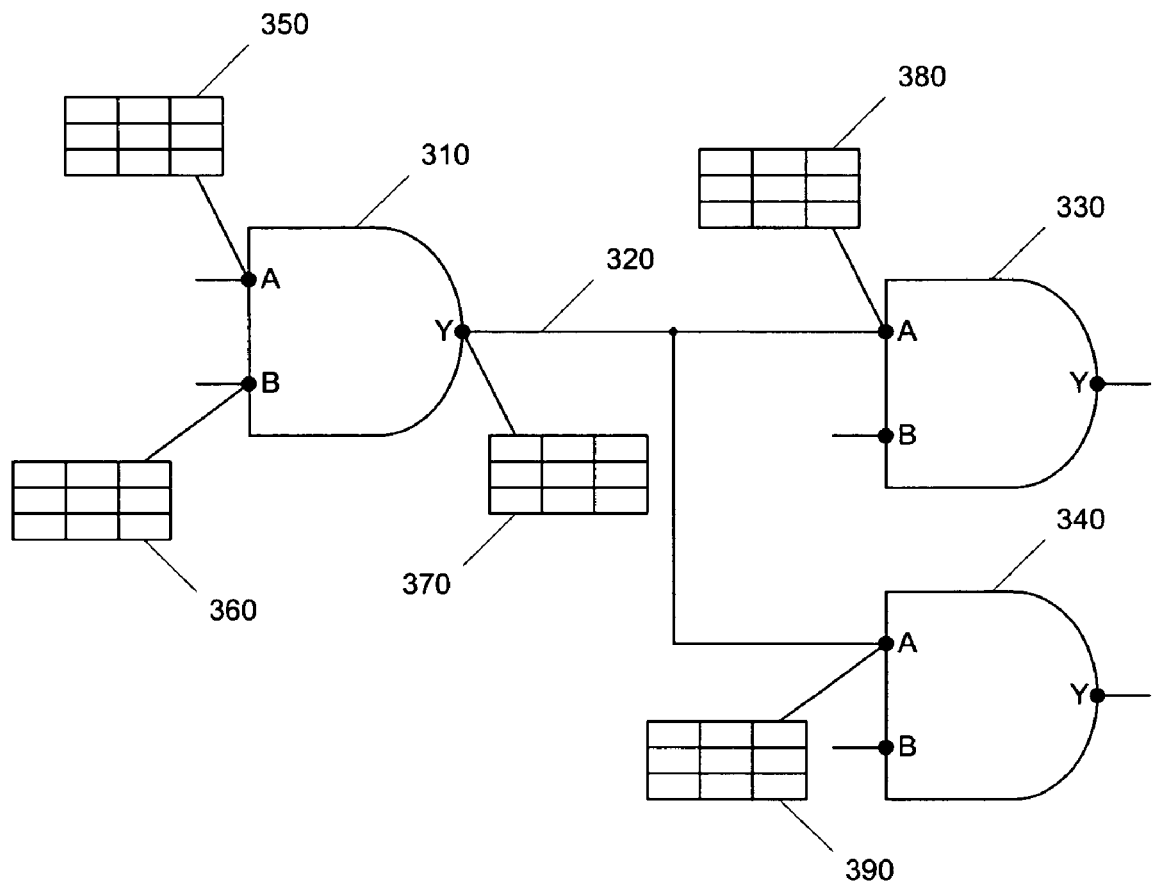
FIG. 3 illustrates a portion of an integrated circuit design illustrating the maintenance of performance data for each corner and each mode.

FIG. 3 illustrates a portion of an example circuit design and a number of data structures to hold timing data at each node. Gates 310, 330 and 340 are connected through interconnect 320. Each pin on each gate constitutes a different node in the circuit graph. The matrices 350, 360, 370, 380 and 390 illustrate the data structures that store performance data for each combination of corner and mode. For example, this matrix could consist of a table such as is illustrated below in Table 1.

TABLE 1

Example Data Structure Contents For One Node

|  | Corner 1 (2.0 V, 25 C) setup/hold | Corner 2 (2.0 V, 140 C) noise | Corner 3 (1.7 V, 140 C) setup |
|---|---|---|---|
| Mode 1 ("sleep") | early arrival time early required time late arrival time late required time | noise value | late arrival time late required time |
| Mode 2 ("standby") | early arrival time early required time late arrival time late required time | noise value | late arrival time late required time |
| Mode 3 ("active") | early arrival time early required time late arrival time late required time | noise value | late arrival time late required time |

In this example, a three-by-three matrix is associated with each node in the circuit graph. The matrix stores timing and noise values for each combination of three corners and three modes. Note that each column of the data structure contains a different amount of data according to which objectives have been defined for that corner. The data structure is carefully architected to allocate storage only for the data defined for each corner. In addition to the values shown in the table above, slew and capacitance are computed for every corner/mode combination since they are needed in any analysis.

FIG. 3 illustrates that a matrix is stored for each node. However, in an alternative embodiment, the data does not need to be stored at all nodes because it can be re-computed based on the data on other nodes. This reduces the memory overhead of the data structure. It may also possible to selectively store data at certain nodes. For example, slew, arrival time, and required time may be stored at a certain node while fast ramp and slow ramp are eliminated. The eliminated data are then re-computed when needed from data at other nodes in the circuit graph.

A single sweep over the timing graph computes the data values in each field of each table. In this way, the preferred embodiment is simultaneously aware of the overall design picture across all combinations of corner and mode. For example, once the arrival times are known for the signals at pins A and B of device 310, the arrival time entries for matrices 350 and 360 can be filled in. Then, using the device libraries for each corner and the timing constraints of each mode, the arrival times for pin Y of device 310 can be computed and filled into matrix 370. This computation will require the load on device 310, so interconnect 320 will have to be characterized first. Similarly, a backward traversal of the circuit graph is performed to fill in the required times for each corner/mode combination.

Note that by integrating the multi-corner, multi-mode analysis with the timing analysis, results can be computed much more efficiently than if each corner/mode combination was run separately. This is because the cost of traversing the circuit graph (which is very expensive) is kept fixed while populating the data structure (which is inexpensive) is multiplied. Thus, the total computational overhead for generating the data for all virtual timing graphs is a small fraction of what would otherwise be required.

c. Convergent Optimization

In a preferred embodiment, the multi-corner, multi-mode analysis is integrated with an optimization sequence. This allows convergent optimization of a design across all corners and all modes simultaneously. Once the data structures are populated with performance data for each node, we are able to look at all combinations of corner and mode and to present the worst violation to the optimizer for optimization.

For example, the worst node in the circuit graph may be in corner 2, mode 3 with violation of −100 ps. When the optimizer fixes this, the next worst one may be in corner 1, mode 2. A preferred embodiment maintains the data structures up-to-date as the optimizer progresses. This means that at all times an integrated picture of the slack of the entire design over all combinations of corner and mode is maintained. Nodes in the circuit graph may be selected to optimize based on the worst negative slack (WNS), or some other factor. The use of bottleneck analysis, as disclosed in co-pending application Ser. No. 10/860,813, filed concurrently herewith, for METHOD AND APPARATUS FOR OPTIMIZATION OF DIGITAL INTEGRATE CIRCUITS USING DETECTION OF BOTTLENECKS, hereby incorporated by reference, may be utilized to select which node or nodes in the circuit graph to optimize.

A preferred embodiment allows the incremental update of the timing graphs over all combinations of corner and mode with minimal CPU computation. As changes are made to the circuit, only the information that needs to be updated is re-computed.

Figure 4:
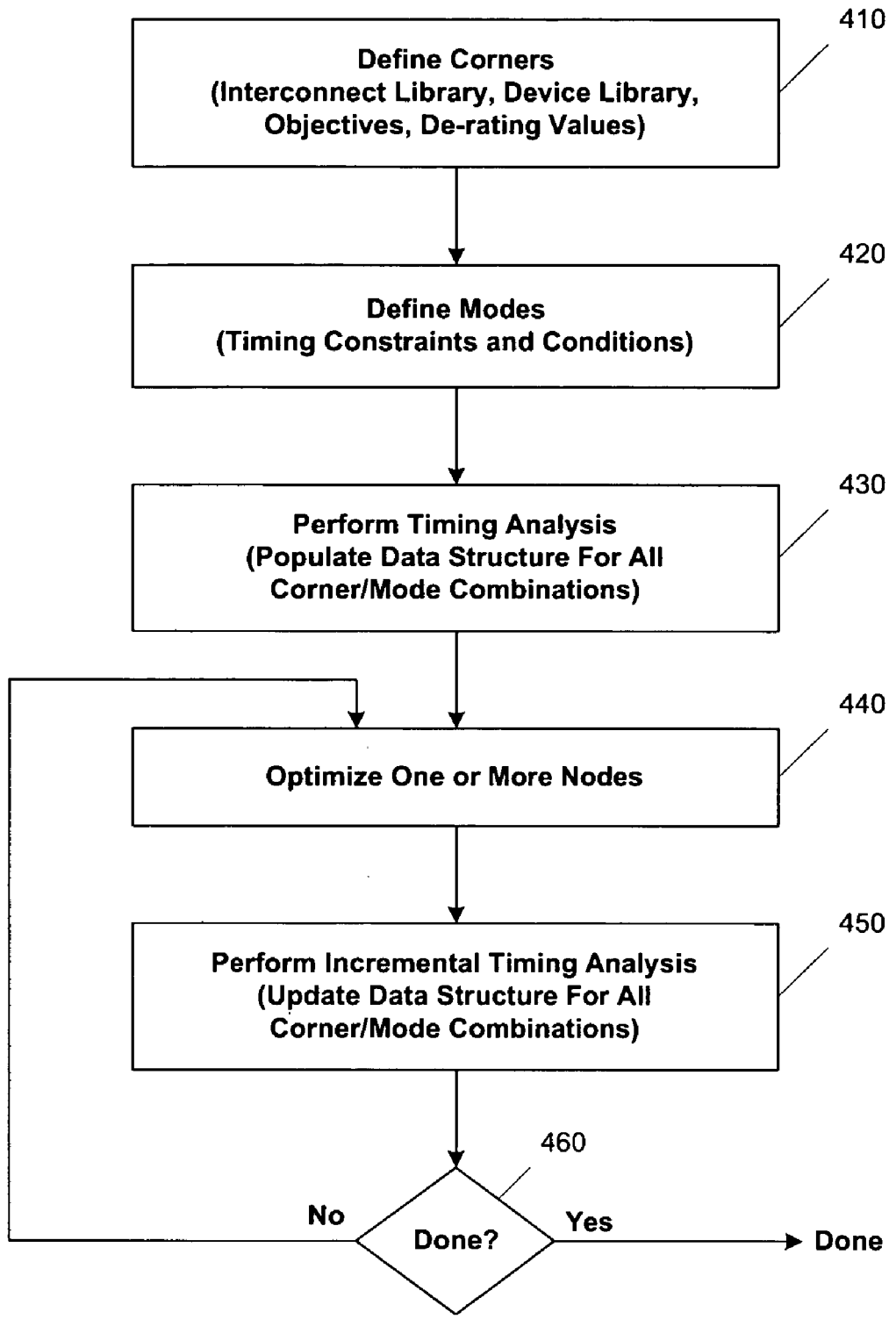
FIG. 4 illustrates a flow chart for one embodiment of the present invention.

FIG. 4 illustrates a flow chart for an embodiment of the present invention. In step 410, the corners are defined. This involves the specification, for each corner, which interconnect PTF file to utilize and which device library or libraries to utilize. In addition, the objective for the corner and linear de-rating values are defined. In the case that local variability is being handled by min/max variation libraries, this is also specified in step 410. In step 420, the modes are defined. A constraint file is specified which includes timing constraints as well as other conditions (such as disabling certain timing arcs or specifying that certain paths are multi-cycle paths). In step 430, a timing analysis of the circuit is performed for all combinations of corner and mode. This involves the traversal of the circuit graph and the filling in of all matrices for the nodes of the graph.

Note that in alternate embodiments, it may not be necessary to maintain complete data at each node since data at intermediate nodes can be re-computed if necessary. Thus, it is possible to trade off memory utilization for CPU utilization, reclaiming the storage for certain matrices and re-computing them if necessary. In step 440, one or more nodes are optimized based on the performance data computed in step 430. In one embodiment, this involves choosing a node with the worst negative slack across all combinations of corner and mode. When one or more changes are made to the circuit in step 440, an incremental timing analysis is performed in step 450. This involves updating the data structure for all combinations of corner and mode. Only the matrices and only the entries within each matrix that is affected by the circuit changes made need be re-computed.

Once a change is made to the circuit, the optimizer typically decides to accept the change based on improvement in the worst slack over all combinations of corner and mode. In this case slack could be "late slack," "early slack," "noise slack," "slew slack," or "capacitance slack." Any of these slacks can be optimized over all combination of corner and mode. The optimization cost function is a combination of all the objectives described above to make decisions to approve or reject changes that the optimization process introduces. In step 460, a termination condition is evaluated and the optimization sequence will either terminate or continue. In one embodiment, the termination condition is a test of whether the worst negative slack has improved by more than a predefined amount since the last circuit change.

In addition to analysis and optimization, a preferred embodiment allows convenient reporting of circuit performance. The default report is the worst path over all combinations of corner and mode, for all setup objectives. Reports can be customized per corner and per mode. A combination of corners can also be supplied to find the worst paths over a collection of setup corners. This is an extremely powerful debugging tool to allow designers to quickly narrow down the cause of an objective violation over any and all combinations of corner and mode. Users can also modify the netlist based on these reports using database editing commands to incrementally update the timing views of the design over all corners and mode combinations.

Figure 5:
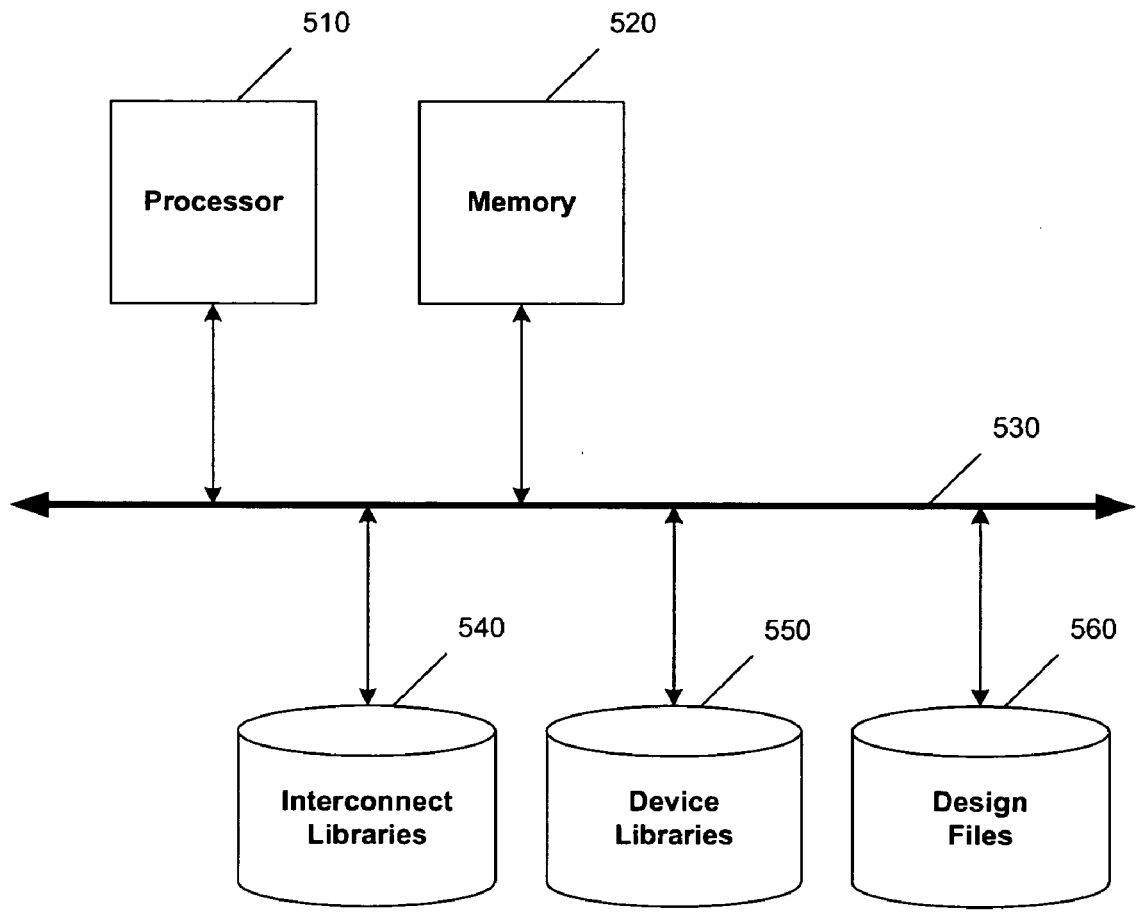
FIG. 5 illustrates a system incorporating one embodiment of the present invention.

FIG. 5 illustrates a computer system incorporating an embodiment of the present invention. Processor 510 is utilized to execute instructions performing the steps described above. Memory 520 is used to hold processor instructions and data representing the circuit design. The computer system of FIG. 5 also incorporates mass storage represented by 540 (interconnect libraries), 550 (device libraries) and 560 (design files).

While the invention has been disclosed with respect to several embodiments, it will be evident that various changes may be introduced by those with ordinary skill in the art to which the invention pertains. The forgoing disclosure is therefore intended to be descriptive and not limiting.

What is claimed is:

1. A method of characterizing performance of an integrated circuit comprising the steps of:

defining a plurality of corners, wherein each one of said plurality of corners defines a combination of boundary conditions selected from a group including environmental variations, manufacturing variations, and reliability variations, said boundary conditions indicative of the operation of said integrated circuit;

defining one or more operational modes for said integrated circuit;

analyzing performance of said integrated circuit for substantially every combination of corner and mode to provide circuit performance data; and populating a data structure storing said circuit performance data.

2. The method of characterizing performance of an integrated circuit according to claim 1, wherein said step of defining a plurality of corners comprises at least one of:

defining a name of an interconnect library;
defining a name of a device library; and
defining a objective.

3. The method of characterizing performance of an integrated circuit according to claim 1, wherein said step of defining one or more operational modes comprises defining a set of timing constraints for each said operational mode.

4. A method of characterizing performance of an integrated circuit comprising the steps of:
   defining a plurality of corners, wherein said step of defining a plurality of corners comprises at least one of:
      defining a name of an interconnect library;
      defining a name of a device library; and
      defining a objective,
   wherein said step of defining an objective comprises at least one of:
      enabling or disabling a setup time objective;
      enabling or disabling a hold time objective; and
      enabling or disabling a noise objective,
   wherein each one of said plurality of corners comprises a plurality of conditions selected from plural manufacturing conditions and plural environmental conditions, said plurality of conditions indicative of the operation of said integrated circuit;
   defining one or more operational modes for said integrated circuit;
   analyzing performance of said integrated circuit for substantially every combination of corner and mode to provide circuit performance data; and
   populating a data structure storing said circuit performance data.

5. The method of characterizing performance of an integrated circuit according to claim 4, wherein said step of defining a plurality of corners further comprises at least one of:
   defining an interconnect de-rating value;
   defining a logic de-rating value; and
   defining a clock de-rating value.

6. A method of characterizing performance of an integrated circuit comprising the steps of:
   defining a plurality of corners, wherein each one of said plurality of corners comprises a plurality of conditions selected from plural manufacturing conditions and plural environmental conditions, said plurality of conditions indicative of the operation of said integrated circuit;
   defining one or more operational modes for said integrated circuit;
   analyzing performance of said integrated circuit for substantially every combination of corner and mode to provide circuit performance data; and
   populating a data structure storing said circuit performance data;
   wherein said step of populating a data structure comprises storing an arrival time and a required time for at least one node of said integrated circuit.

7. A method of characterizing performance of an integrated circuit comprising the steps of:
   defining a plurality of corners, wherein each one of said Plurality of corners comprises a plurality of conditions selected from plural manufacturing conditions and plural environmental conditions, said plurality of conditions indicative of the operation of said integrated circuit;
   defining one or more operational modes for said integrated circuit;
   analyzing performance of said integrated circuit for substantially every combination of corner and mode to provide circuit performance data; and
   populating a data structure storing said circuit performance data;
   further comprising the step of reporting a worst timing violation across all combinations of corner and mode.

8. A method for optimizing an integrated circuit design comprising the steps of:
   defining a plurality of corners, wherein each one of said plurality of corners defines a combination of boundary conditions selected from a group including environmental variations, manufacturing variations, and reliability variations, said boundary conditions indicative of the operation of an integrated circuit characterized by said integrated circuit design;
   defining one or more operational modes for said integrated circuit characterized by said integrated circuit design;
   computing performance data for substantially every combination of corner and mode;
   altering said integrated circuit design; and
   updating said performance data for substantially every combination of corner and mode.

9. The method of optimizing an integrated circuit design according to claim 8, wherein said step of defining a plurality of corners comprises at least one of:
   defining a name of an interconnect library;
   defining a name of a device library; and
   defining a objective.

10. The method of optimizing an integrated circuit design according to claim 8, wherein said step of defining one or more operational modes mode comprises defining a set of timing constraints for each said operational mode.

11. The method of optimizing an integrated circuit design according to claim 8, wherein said step of computing performance data comprises populating a data structure storing circuit performance data, and wherein said step of updating said performance data comprises updating said data structure.

12. A method for optimizing an integrated circuit design comprising the steps of:
   defining a plurality of corners,
   wherein said step of defining a plurality of corners comprises at least one of:
      defining a name of an interconnect library;
      defining a name of a device library; and
      defining a objective,
   wherein said step of defining an objective comprises at least one of:
      enabling or disabling a setup time objective;
      enabling or disabling a hold time objective; and
      enabling or disabling a noise objective,
   wherein each one of said plurality of corners comprises a plurality of conditions selected from plural manufacturing conditions and plural environmental conditions, said plurality of conditions indicative of the operation of an integrated circuit characterized by said integrated circuit design;
   defining one or more operational modes for said integrated circuit characterized by said integrated circuit design;
   computing performance data for substantially every combination of corner and mode;
   altering said integrated circuit design; and
   updating said performance data for substantially every combination of corner and mode.

13. The method of optimizing an integrated circuit design according to claim 12, wherein said step of defining a plurality of corners further comprises at least one of:

defining an interconnect de-rating value;
defining a logic de-rating value; and
defining a clock de-rating value.

14. A method of creating a plurality of virtual timing graphs for an integrated circuit design comprising the steps of:
    defining a plurality of corners, wherein each one of said plurality of corners defines a combination of boundary conditions selected from a group including environmental variations, manufacturing variations, and reliability variations, said boundary conditions indicative of the operation of an integrated circuit characterized by said integrated circuit design;
    defining one or more operational modes for said integrated circuit characterized by said integrated circuit design;
    computing circuit performance data for each said virtual timing graph, wherein each said virtual timing graph is associated with a distinct combination of corner and mode; and
    populating a data structure storing said circuit performance data.

15. The method of creating a plurality of virtual timing graphs according to claim 14, wherein said step of defining a plurality of corners comprises at least one of:
    defining a name of an interconnect library;
    defining a name of a device library; and
    defining a objective.

16. The method of creating a plurality of virtual timing graphs according to claim 14, wherein said step of defining one or more operational modes mode comprises defining a set of timing constraints for each said operational mode.

17. A method of creating a plurality of virtual timing graphs for an integrated circuit design comprising the steps of:
    defining a plurality of corners,
    wherein said step of defining a Plurality of corners comprises at least one of:
        defining a name of an interconnect library;
        defining a name of a device library; and
        defining a objective,
    wherein said step of defining an objective comprises at least one of:
        enabling or disabling a setup time objective;
        enabling or disabling a hold time objective; and
        enabling or disabling a noise objective,
    wherein each one of said plurality of corners comprises a plurality of conditions selected from plural manufacturing conditions and plural environmental conditions, said plurality of conditions indicative of the operation of an integrated circuit characterized by said integrated circuit design;
    defining one or more operational modes for said integrated circuit characterized by said integrated circuit design;
    computing circuit performance data for each said virtual timing graph, wherein each said virtual timing graph is associated with a distinct combination of corner and mode; and
    populating a data structure storing said circuit performance data.

18. The method of creating a plurality of virtual timing graphs according to claim 17, wherein said step of defining a plurality of corners further comprises at least one of:
    defining an interconnect de-rating value;
    defining a logic de-rating value; and
    defining a clock de-rating value.

19. A method of creating a plurality of virtual timing graphs for an integrated circuit design comprising the steps of:
    defining a plurality of corners, wherein each one of said plurality of corners comprises a plurality of conditions selected from plural manufacturing conditions and plural environmental conditions, said plurality of conditions indicative of the operation of an integrated circuit characterized by said integrated circuit design;
    defining one or more operational modes for said integrated circuit characterized by said integrated circuit design;
    computing circuit performance data for each said virtual timing graph, wherein each said virtual timing graph is associated with a distinct combination of corner and mode; and
    populating a data structure storing said circuit performance data;
    wherein said step of populating a data structure comprises storing an arrival time and a required time for at least one node of said integrated circuit design.

20. A method of creating a plurality of virtual timing graphs for an integrated circuit design comprising the steps of:
    defining a plurality of corners, wherein each one of said plurality of corners comprises a plurality of conditions selected from plural manufacturing conditions and plural environmental conditions, said plurality of conditions indicative of the operation of an integrated circuit characterized by said integrated circuit design;
    defining one or more operational modes for said integrated circuit characterized by said integrated circuit design;
    computing circuit performance data for each said virtual timing graph, wherein each said virtual timing graph is associated with a distinct combination of corner and mode; and
    populating a data structure storing said circuit performance data;
    further comprising the step of reporting a worst timing violation across all said virtual timing graphs.

21. An integrated circuit design optimized according to the steps of:
    defining a plurality of corners, wherein each one of said plurality of corners defines a combination of boundary conditions selected from a group including environmental variations, manufacturing variations, and reliability variations, said boundary conditions indicative of the operation of an integrated circuit characterized by said integrated circuit design;
    defining one or more operational modes for said integrated circuit characterized by said integrated circuit design;
    computing performance data for substantially every combination of corner and mode;
    altering said integrated circuit design; and
    updating said performance data for substantially every combination of corner and mode.

22. A computer program product comprising a computer usable medium having computer readable program code embodied therein configured to perform method steps to optimize an integrated circuit design, said method steps comprising:
    defining a plurality of corners, wherein each one of said plurality of corners defines a combination of boundary conditions selected from a group including environmental variations, manufacturing variations, and reliability variations, said boundary conditions indicative of the operation of an integrated circuit characterized by said integrated circuit design;

defining one or more operational modes for said integrated circuit characterized by said integrated circuit design;

computing performance data for substantially every combination of corner and mode;

altering said integrated circuit design; and updating said performance data for substantially every combination of corner and mode.

* * * * *